(12) United States Patent
Fischer et al.

(10) Patent No.: US 10,151,815 B2
(45) Date of Patent: Dec. 11, 2018

(54) MULTI-ECHO PRESTO

(71) Applicant: KONINKLIJKE PHILIPS N.V., Eindhoven (NL)

(72) Inventors: Stefan E. Fischer, Beachwood, OH (US); Craig Kenneth Jones, Reisterstown, MD (US); Melanie Suzanne Kotys, Shaker Heights, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 946 days.

(21) Appl. No.: 14/401,939

(22) PCT Filed: May 21, 2013

(86) PCT No.: PCT/IB2013/054183
§ 371 (c)(1),
(2) Date: Nov. 18, 2014

(87) PCT Pub. No.: WO2013/175403
PCT Pub. Date: Nov. 28, 2013

(65) Prior Publication Data
US 2015/0108976 A1    Apr. 23, 2015

Related U.S. Application Data

(60) Provisional application No. 61/650,501, filed on May 23, 2012.

(51) Int. Cl.
*G01V 3/00* (2006.01)
*G01R 33/561* (2006.01)
(Continued)

(52) U.S. Cl.
CPC ..... *G01R 33/5616* (2013.01); *G01R 33/5618* (2013.01); *G01R 33/4828* (2013.01); *G01R 33/56341* (2013.01)

(58) Field of Classification Search
CPC .................................................. G01R 33/5616
(Continued)

(56) References Cited

U.S. PATENT DOCUMENTS 6,057,686 A   5/2000   Van Den Brink et al.
6,326,786 B1  12/2001  Pruessmann et al.
(Continued)

FOREIGN PATENT DOCUMENTS

JP    2003010228 A    1/2003
WO    199317352 A1    9/1993

OTHER PUBLICATIONS

Liu Giioying et al., "A Functional MRI Technique Combining Principles of Echo-Shifting with a Train of Observations (PRESTO)", Magnetic Resonance in Medicine, 1993, vol. 30, Nr. 6, pp. 764-768.
(Continued)

*Primary Examiner* — Louis Arana

(57) ABSTRACT

A magnetic resonance imaging system (78) includes a magnetic resonance imaging device (80), one or more processors (104), and a display (106). The magnetic resonance imaging device (80) includes a magnet (82), gradient coils (88), and one or more radio frequency coils (92). The magnet (82) generates a Bo field. The gradient coils (88) apply gradient fields to the Bo field. The one or more radio frequency coils (92) generate a radio frequency pulse to excite magnetic resonance and measure generated gradient echoes. The one or more processors (104) are configured to activate (116) the one or more radio frequency coils (92) to generate a series of radio frequency pulses spaced by repetition times and to induce magnetic resonance. The one or more processors (104) are configured to control (118) the gradient coils to apply after each RF pulse readout gradient field pulses which refocus the resonance into a plurality of gradient echoes, shift and refocus gradient field pulses which shift and refocus at least one of the echoes to a
(Continued)

Figure 1:
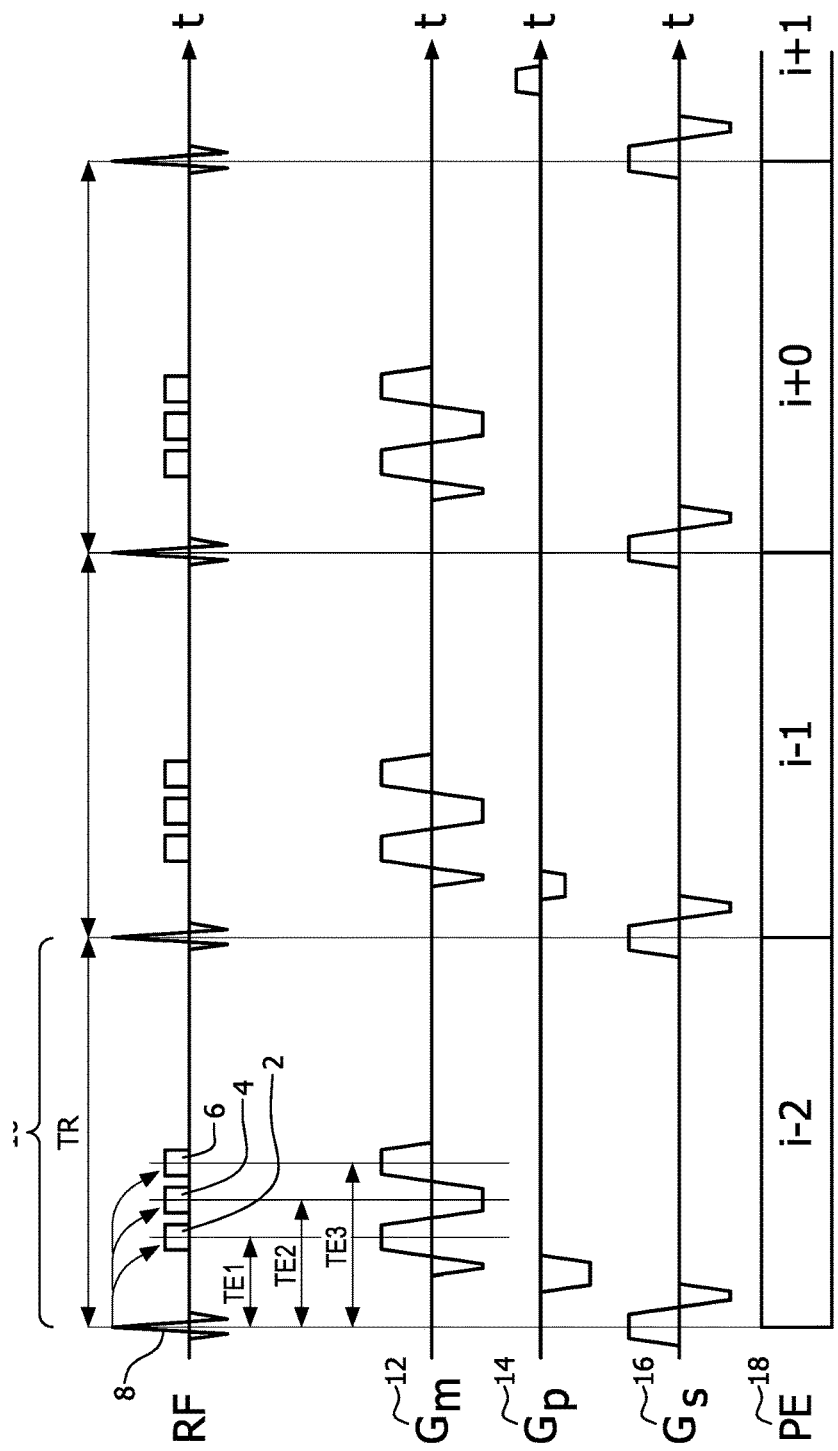

subsequent repetition time, and receive and demodulate the gradient echoes to form k-space data lines. The one or more processors are configured to reconstruct (124) one or more images from the measured one or more gradient echoes. A display (106) displays the one or more reconstructed images.

19 Claims, 8 Drawing Sheets

(51) Int. Cl.
  *G01R 33/48* (2006.01)
  *G01R 33/563* (2006.01)
(58) Field of Classification Search
  USPC .................................. 324/309, 307, 306
  See application file for complete search history.

(56) References Cited

U.S. PATENT DOCUMENTS

| | | | |
|---|---|---|---|
| 6,389,304 | B1 | 5/2002 | Van Den Brink et al. |
| 7,141,972 | B2 | 11/2006 | Avram |
| 2008/0012564 | A1 | 1/2008 | Lin |
| 2008/0027282 | A1 | 1/2008 | Matsui et al. |
| 2008/0272782 | A1 | 11/2008 | Lin |
| 2009/0299172 | A1 | 12/2009 | Corot et al. |
| 2012/0112743 | A1 | 5/2012 | Gralund |
| 2017/0242087 | A1* | 8/2017 | Zho ...................... G01R 33/543 |

OTHER PUBLICATIONS

Liu Giioying et al., "Fast Echo-Shifted Gradient-Recalled MRI: Combining a Short Repetition Time with Variable T2* Weighting", Magnetic Resonance in Medicine, 1993, vol. 30(1), pp. 68-75.
Liu, G. et al "A Functional MRI Technique combining Principles of Echo-Shifting with a Train of Observations (PRESTO)", Magnetic Resonance in Medicine, vol. 30, No. 6, Dec. 1993, pp. 764-768.
Hans Hoogduin et al Dual-Echo PRESTO: Fast 3D fMRI with SImultaneous Measurement of Changes in Baseline Signal 10 and in T2*, Proceedings of the International Society for Magnetic Resonance in Medicine, vol. 7, May 1999, p. 1763.
Hans Hoogduin et al "Multi-Echo PRESTO: T2* Mapping for 3D fMRI", Proceedings of the International Society for Magnetic Resonance in Medicine, Apr. 2000, pp. 59.
Flacke, S. et al "Ultra-Fast Three-Dimensional R Perfusion Imaging of the Entire Brain in Acute Stroke Assessment", Journal of Magnetic Resonance Imaging, vol. 11, No. 3, Mar. 2000, pp. 255.
Van Gelderen, P. et al The PRESTO Technique for fMRI, Neuroimage, vol. 62, No. 2, Jan. 2012, pp. 676-681.
Liu, Guoying et al "Fast Echo-Shifted Gradient-Recalled MRI: Combining a Short Repetition Time with Variable T2* Weigting" Magnetic Resonance in Medicine, vol. 30, No. 1, Jul. 1993, pp. 68-75.
Moonen, C.T.W. et al "A Fast Gradient-Recalled MRI Technique with Increased Sensitivity to Dynamic Susceptibility Effects" Magnetic Resoannce in Medicine, vol. 26, No. 1, Jul. 1992, pp. 184-189.
Klarhofer, Markus et al "A PRESTO_SENSE Sequence with Alternating Partial-Fourier Encoding for Rapid Susceptibility-Weighted 3D MRI TIme Series", Magnetic Resonance in Medicine, vol. 50, 2003, pp. 830-838.
Delalande, Christophe et al "An Echo-Shifted Gradient-Echo MRI Method for Efficient Diffusion Weighting", Magnetic Resonance in Medicine, vol. 41, 1999, pp. 1000-1008.
LeBihan et al "Separation of Diffusion and Perfusion in Intravoxel Incoherent Motion MR Imaging" Radiology, 1988, p. 497-505.
Kwee et al "Diffusion Weighted Whole-Body Imaging with Background Body Signal Suppression (DWIBS) . . . " Eur Radiot (2008) 18: p. 1937-1952.
Glover GH, Schneider E., Three-point Dixon technique for true water/fat decomposition with B0 inhomogeneity correction. Magn Reson Med. Apr. 1991; 18(2):371-83.
Ahn CB, Lee SY, Nalcioglu O, Cho ZH., An improved nuclear magnetic resonance diffusion coefficient imaging method using an optimized pulse sequence., Med Phys. Nov.-Dec. 1986; 13(6):789-93.

* cited by examiner

MULTI-ECHO PRESTO

CROSS-REFERENCE TO PRIOR APPLICATIONS

This application is the U.S. National Phase application under 35 U.S.C. § 371 of International Application No. PCT/IB2013/054183, filed on May 21, 2013, which claims the benefit of U.S. Provisional Patent Application No. 61/650,501, filed on May 23, 2012. These applications are hereby incorporated by reference herein.

The following relates generally to magnetic resonance techniques. It finds particular application in conjunction with magnetic resonance imaging sequences, and will be described with particular reference thereto. However, it will be understood that it also finds application in other usage scenarios and is not necessarily limited to the aforementioned application.

Magnetic resonance excites resonance in a subject by using a radio frequency pulse. The resonance can be refocused using radio frequency and/or gradient field pulses in a specific volume such as a slice, slab, or 3D volume. The radio frequency pulse is applied once each repetition time (TR). A TR typically occurs at intervals which allow the decay of resonance sufficiently for a new pulse to be applied. Gradient fields are magnetic fields applied by one or more gradient coils which can refocus or spatially encode the magnetic resonance in a specific volume. As the magnetic resonance naturally decays between pulses, induced magnetic resonance echoes are received by radio frequency coils. The echoes are measured or read-out at specific times and for specific volumes. The time at which each echo occurs is called the echo time (TE). Typically, echo times occur within each TR. Measured echoes are decoded into lines of k-space data which are used to reconstruct images. Echo times measured for specific magnetic resonance configurations are used to reconstruct images with certain characteristics. For example, T1 weighted images contrast water darker and fat brighter and use short TR and TE periods, and T2 weighted images contrast fat darker and water lighter and use longer TR and TE periods. In another example, T2* weighted images use long TR and TE periods, and contrast diffusion.

Imaging which shows diffusion often involves long TEs. Principles of echo shifting with a train of observations (PRESTO) imaging uses an echo time longer than the repetition time, e.g. TE>TR. However, PRESTO imaging generates a single echo each TR.

Current multi-echo imaging performs multiple imaging sequences in one sequence, but has been limited to echo times less than the repetition time. Multi-echo imaging can replace multiple single echo imaging sequences in which each imaging sequence is run separately and consecutively. Multi-echo imaging measures each of a plurality of echoes in each TR, and permits reconstruction of an image corresponding to each echo.

In order to perform diffusion weighted imaging and other weighted imaging on a patient, multiple imaging sequences are performed consecutively. Running multiple individual sequences increases the overall time a Magnetic Resonance scanner is utilized for each patient, and decreases patient throughput.

The following discloses a new and improved magnetic resonance multi-echo technique with shifting sequences which addresses the above referenced issues, and others.

In accordance with one aspect, a magnetic resonance imaging system includes a magnetic resonance imaging device, one or more processors, and a display. The magnetic resonance imaging device includes a magnet, gradient coils, and one or more radio frequency coils. The magnet generates a $B_0$ field. The gradient coils apply gradient fields to the $B_0$ field. The one or more radio frequency coils generate a radio frequency pulse to excite magnetic resonance and measure generated gradient echoes. The one or more processors are configured to activate the one or more radio frequency coils to generate a series of radio frequency pulses spaced by repetition times and to induce magnetic resonance. The one or more processors are configured to control the gradient coils to apply after each RF pulse readout gradient field pulses which refocus the resonance into a plurality of gradient echoes, shift and refocus gradient field pulses which shift and refocus at least one of the echoes to a subsequent repetition time, and receive and demodulate the gradient echoes to form k-space data lines. The one or more processors are configured to reconstruct one or more images from the measured one or more gradient echoes. A display displays the one or more reconstructed images.

In accordance with another aspect, a method of magnetic resonance imaging includes applying a series of radio frequency pulses separated by repetition times, each radio frequency pulse inducing magnetic resonance. Readout gradient field pulses are applied to induce a plurality of magnetic resonance echoes and shift and refocus magnetic field gradient pulses to shift and refocus at least one of the induced gradient echoes in a subsequent repetition time. The gradient echoes are measured to generate data lines. A plurality of images are reconstructed from the data lines.

In accordance with another aspect, a magnetic resonance imaging system includes a magnetic resonance imaging device and one or more processors configured to activate one or more radio frequency coils which generate a radio frequency pulse at the start of each of a plurality of repetition times. The one or more processors are configured to activate gradient coils to induce at least two gradient echoes in each repetition time. The one or more processors are configured to activate the gradient coils to apply one or more first gradient fields which shifts at least one induced gradient echo from a current repetition time, and apply one or more second gradient fields which refocuses the at least one shifted gradient echo in a subsequent repetition time. The one or more processors are configured to reconstruct images from the induced gradient echoes measured by one or more radio frequency coils.

One advantage is the echo time and diffusion weighting of each echo is independent of the repetition time.

Another advantage resides in the combining of multiple sequences into a single sequence.

Another advantage resides in reducing dead time in a sequence when combining multiple sequences.

Another advantage is the reducing in imaging time to perform a wide range of neurological and oncological imaging sequences.

Another advantage resides in the use of existing imaging device hardware to perform the imaging sequences.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 diagrammatically illustrates a prior art multi-echo imaging sequence.

Figure 2:
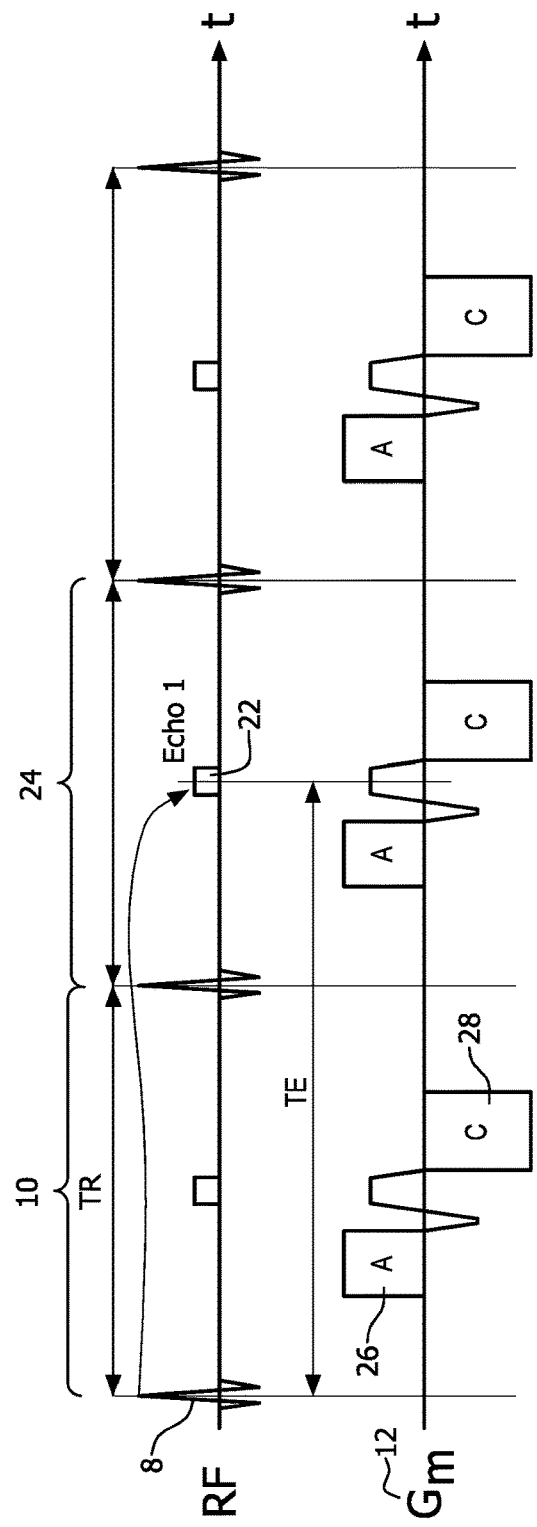

FIG. 2 diagrammatically illustrates a prior PRESTO imaging sequence.

Figure 3:
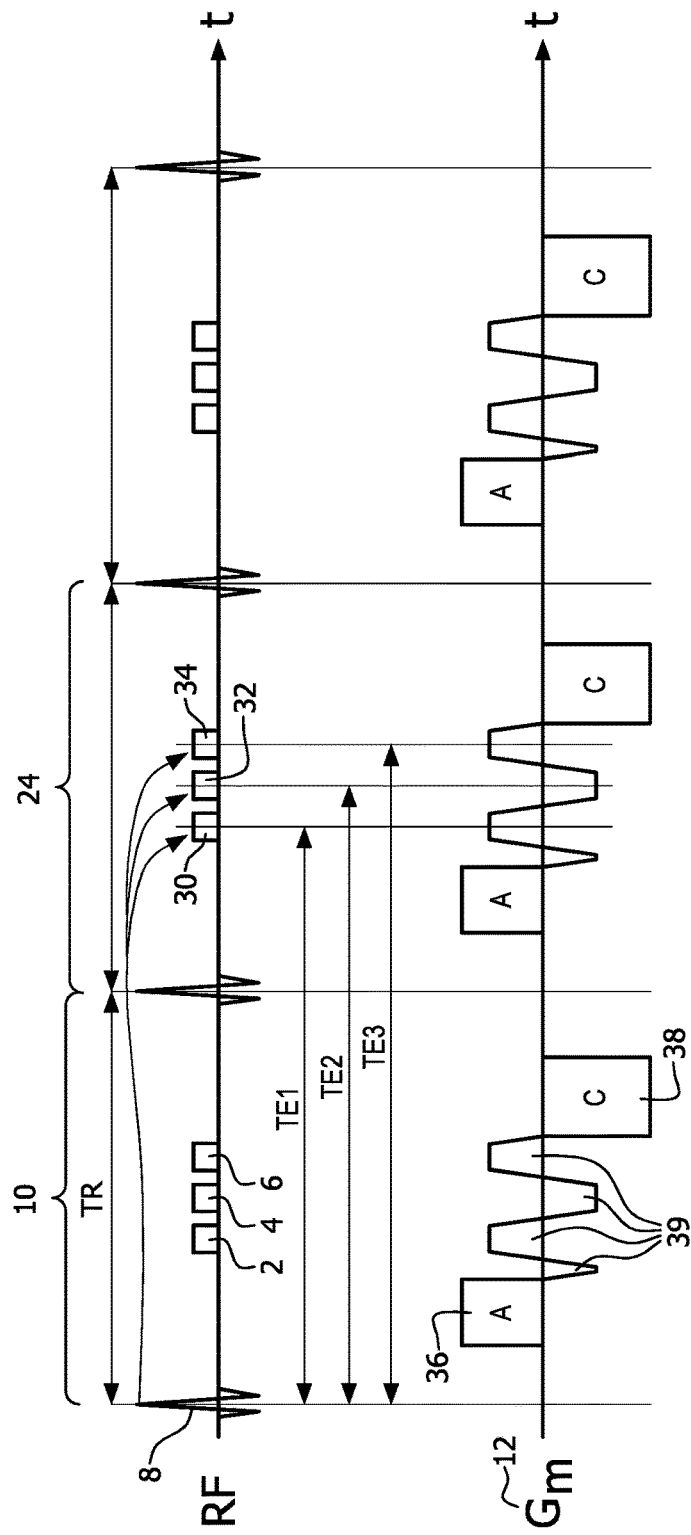

FIG. 3 diagrammatically illustrates an embodiment of a multi-echo PRESTO imaging sequence with multiple echoes shifted.

Figure 4:
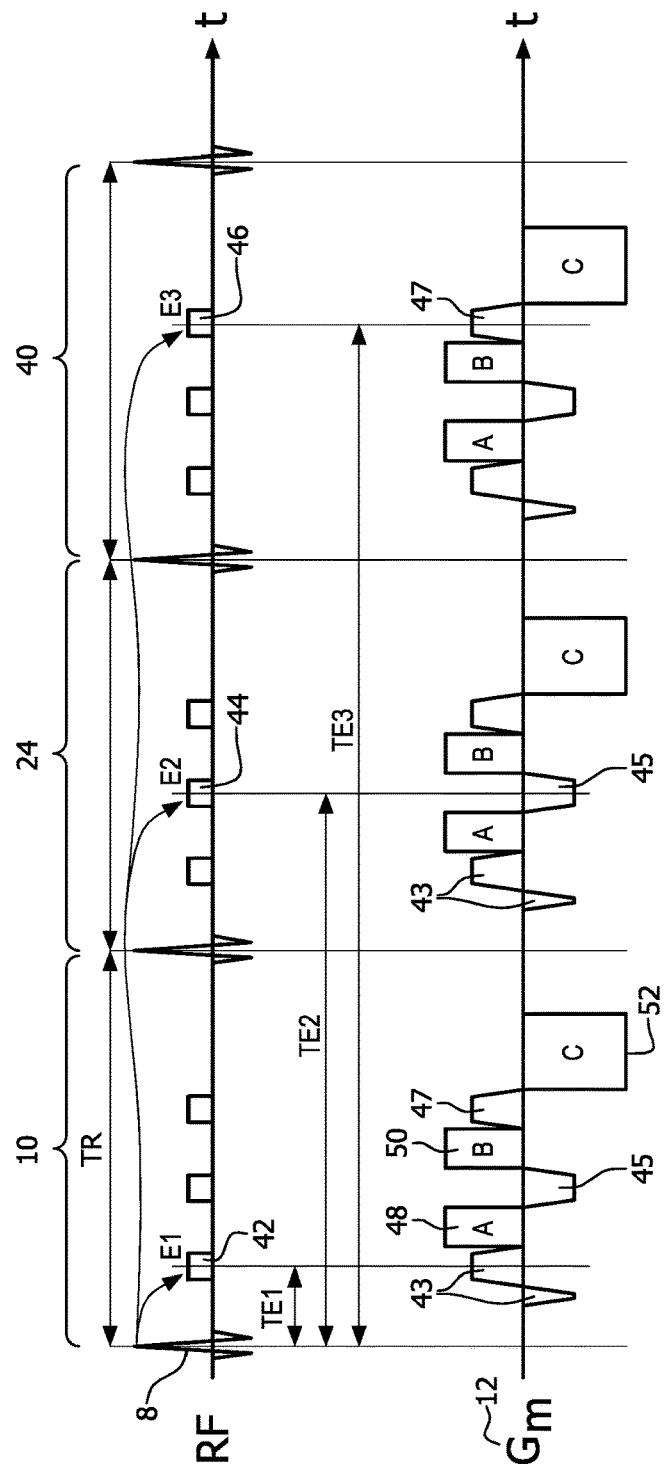

FIG. 4 diagrammatically illustrates an embodiment of a multi-echo PRESTO imaging sequence with echoes shifted to different TRs.

Figure 5:
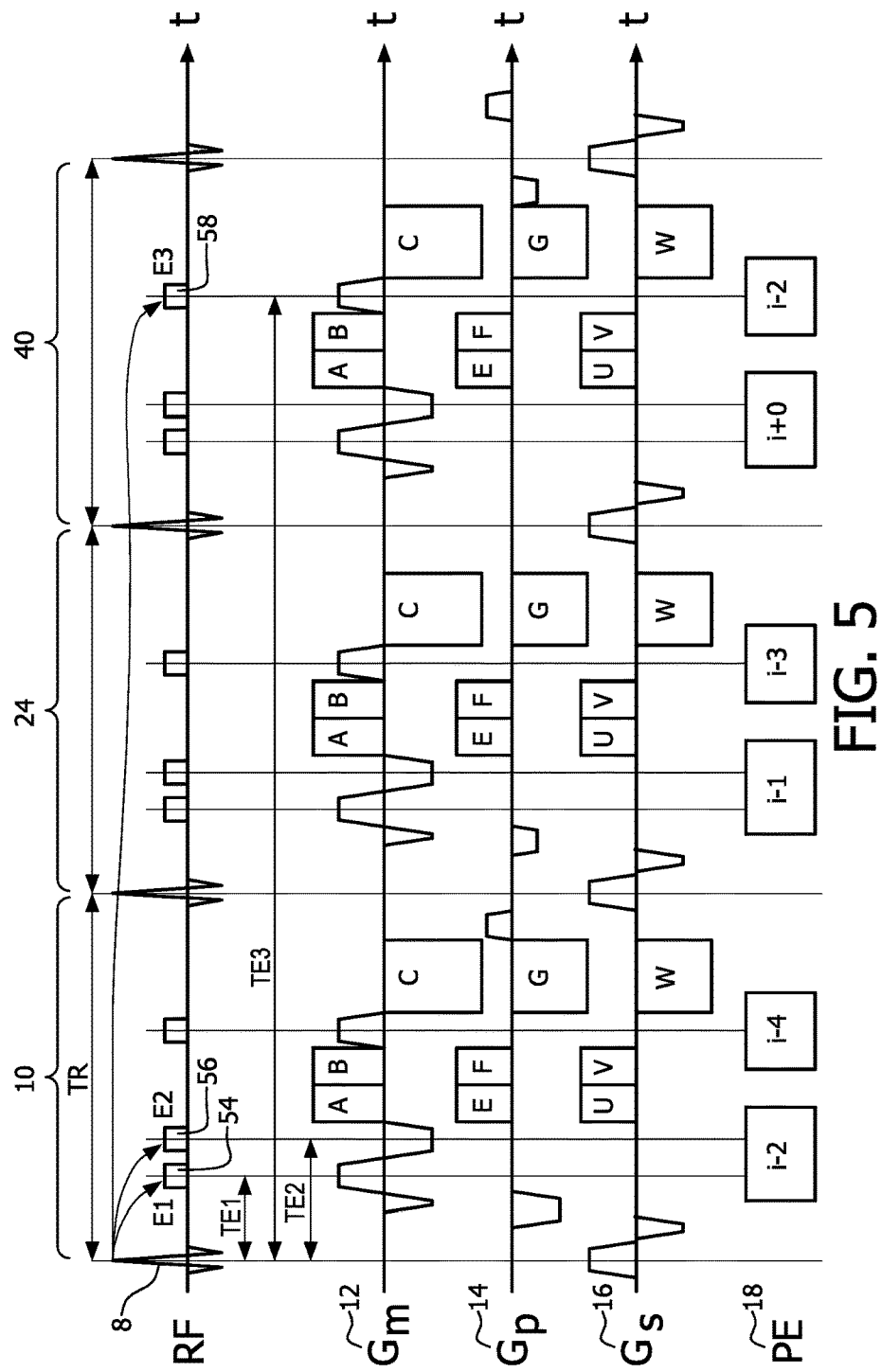

FIG. 5 diagrammatically illustrates an embodiment of a multi-echo PRESTO imaging sequence such as combined Dixon and DWI reconstructions.

Figure 6:
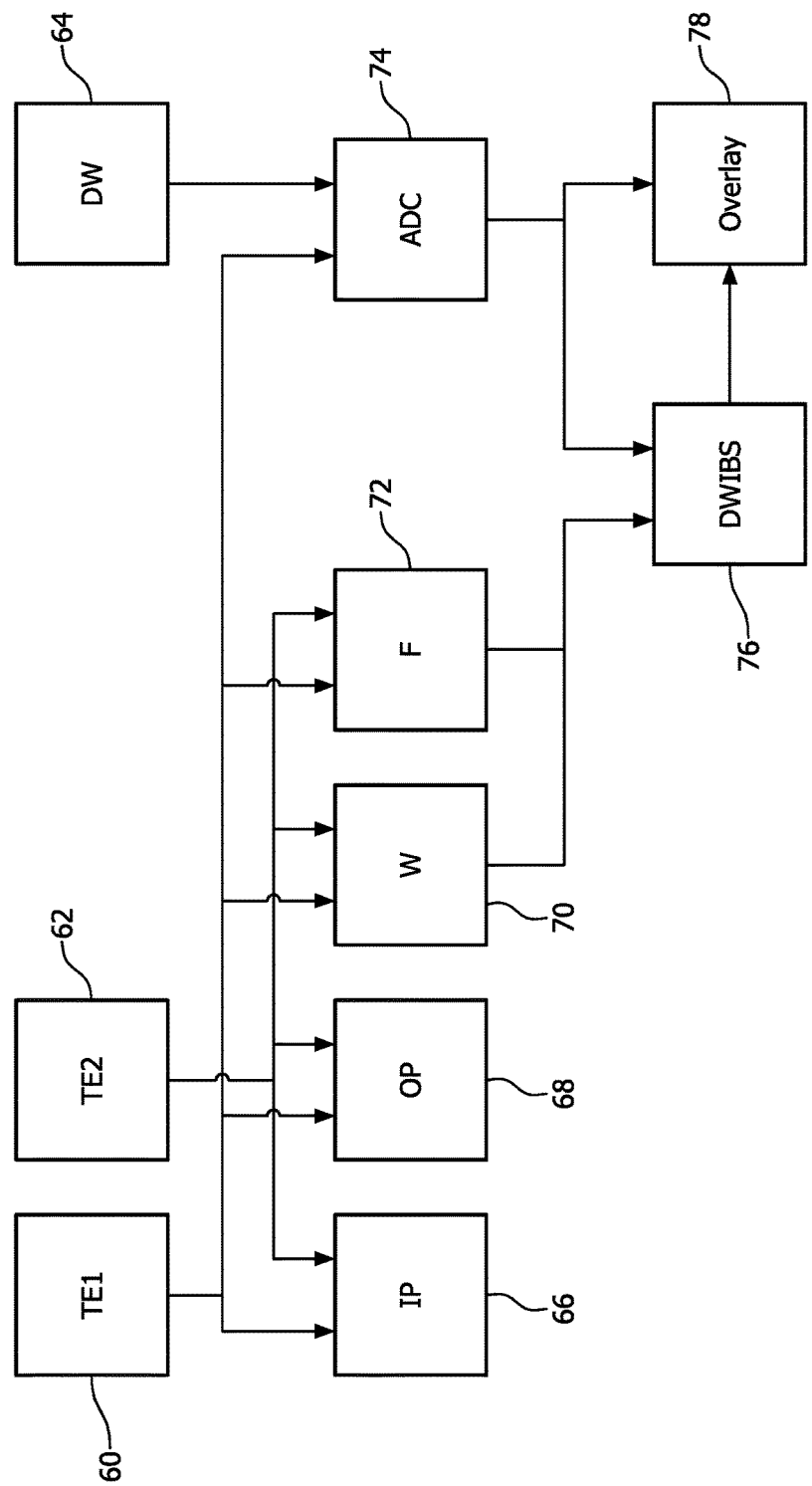

FIG. 6 diagrammatically illustrates an embodiment of a diffusion weighted image whole body (DWIBS) reconstruction based on a combined DWI PRESTO imaging sequence.

Figure 7:
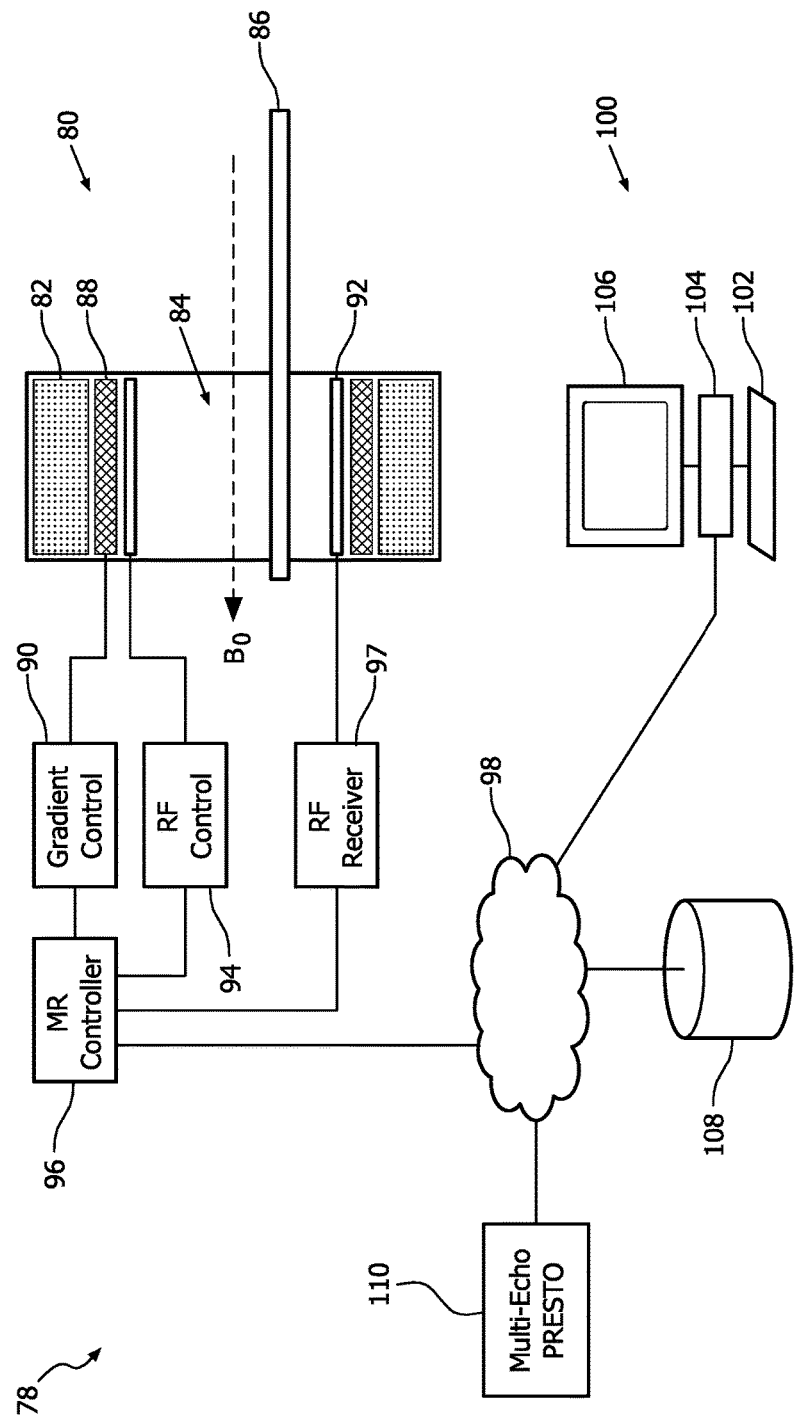

FIG. 7 schematically diagrams an embodiment of a MR system.

Figure 8:
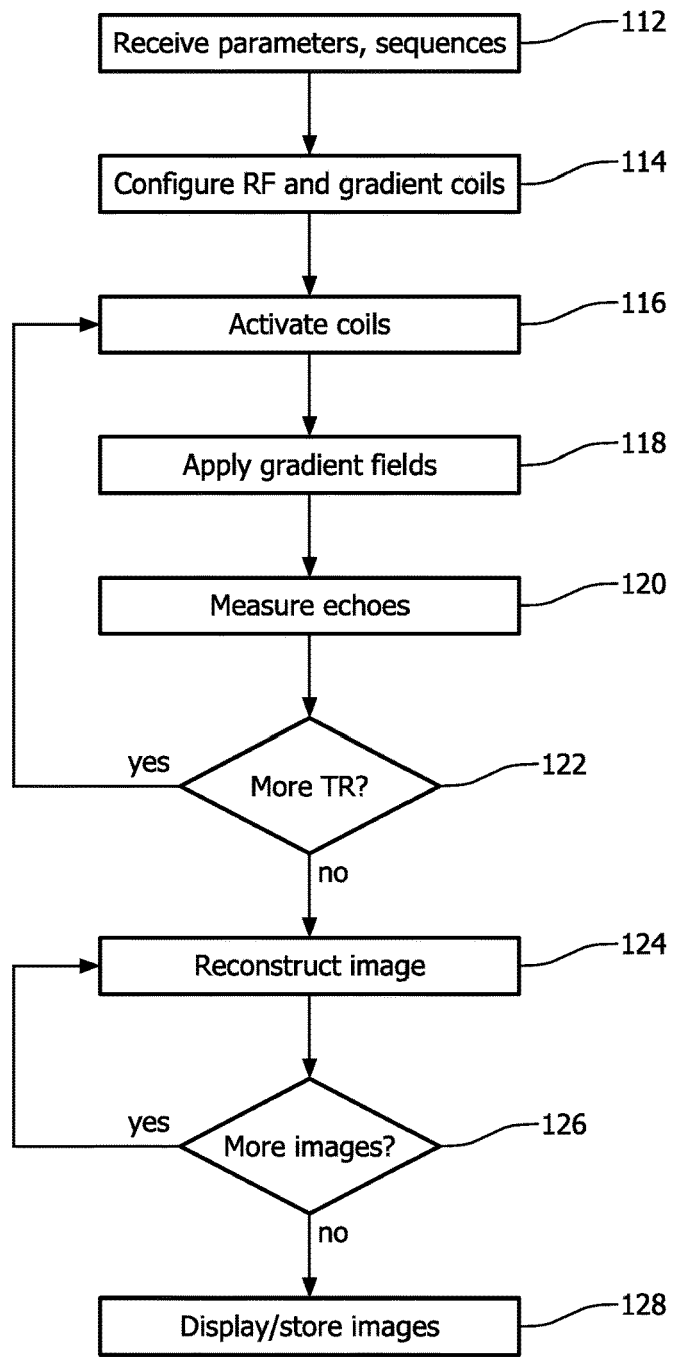

FIG. 8 flowcharts one method of using an embodiment of the multi-echo PRESTO imaging.

With reference to FIG. 1, an illustrated multi-echo imaging sequence includes three echoes E1 2, E2 4, and E3 6 each generated by a radio frequency pulse (RF) 8 and refocused and readout with gradients, $G_m$ 12, within the current repetition time (TR) 10. A phase encode gradient, $G_p$ 14, encodes all three echoes with a phase encoding, PE 18 corresponding to a common line of k-space j−2, j−1, . . . . A slice select gradient, $G_s$ 16, limits the executed resonance, hence the read-out data to a single selected slice. The echo times for the first echo is TE1 2, the second echo time is TE2 4, and the third echo time is TE3 4, and all are less than TR. In each successive TR the sequence is repeated, but with the encoding phase stepped up by one line of k-space, until k-space is filled for the selected slice. Three separate images can be constructed from this sequence based on each of TE1, TE2, and TE3. For example, spatially corresponding T1 weighted, T2 weighted, and T2* weighted images can be generated in such a multi-echo sequence.

With reference to FIG. 2, a PRESTO echo shift imaging sequence is diagrammatically illustrated. Unlike the echoes of the example of FIG. 1 in which the echo occurs in the first TR 10 after the excitation pulse, the echo is shifted into a subsequent TR. A first echo 22 generated with the first RF pulse 8 occurs in the second TR 24. The first echo occurs with an echo time (TE), which is longer than the TR. The shift occurs because of a first or shift gradient field pulse 26 is applied which shifts the echo, and a second or refocus gradient field pulse 28 is applied, which refocuses the echo in the next TR. In each TR, the process is repeated to shift the echo to the next TR. With a long echo time which is greater than the repetition time, e.g. TE>TR, diffusion can be measured through the measured gradient 12. A diffusion weighted image can be reconstructed by reconstructing the set of k-space data lines read-out from the gradient echoes generated by the sequence of FIG. 2.

FIG. 3 diagrammatically illustrates an embodiment in which multiple echoes are shifted to a subsequent TR. The RF pulse 8 with the gradients $G_m$ generates 3 echoes 30, 32, 34 which are shifted to the next TR 24 and measured or readout in the next TR. By shifting to the next TR, the echo times of the three echoes 30, 32, 34 are extended to TE1, TE2, and TE3, which represent the time from the first RF pulse 8 to the time where the echoes are measured. The multiple echoes are shifted by a first or shifting gradient field pulse 36, applied just prior to gradient echo readout pulses 39, and a second or refocusing gradient field pulse of opposite polarity 38 to the shifting pulse applied after the gradient echo readout pulses and prior to the next RF pulse or TR period. The relationship between the areas (duration× amplitude) of the first and second gradient pulses for a multi-echo shift is given by:

$$C = A((n+1)/n) + m \quad (1)$$

where A is the area of the first gradient field pulses, C is the area of the second gradient field pulses, n is the number of TR intervals to shift and greater than 1, and 2m is the total area of the measurement or readout gradient pulses 39. A is freely selectable and C is dependent upon the choice of A. An example of this sequence includes a $B_0$ mapping and a Dixon reconstruction at longer echo times. $B_o$ mapping can be used for image passed shimming and image correction. Another example includes phase mapping which includes temperature mapping.

With reference to FIG. 4, an embodiment of a multi-echo PRESTO imaging sequence with echoes shifted to different TRs is diagrammatically illustrated. The first RF pulse 8 and gradient pulses are configured to generate three echoes 42, 44, 46. The first echo 42 is induced and readout within the current TR 10 by the readout pulses 43. The second echo 44 is induced by readout gradient 45 and shifted and refocused to the next TR 24 by shift gradient pulse 48 and refocus gradient pulses 52. The third echo 46 is induced by readout gradient 47 and shifted and refocused to a third TR 40 by shift and refocus gradients 50, 52. The TE of each echo is the time from the first RF pulse 8 to the time of the measured echo. For the second echo, this includes an additional TR. For the third echo, this includes two additional TRs. Each echo is shifted with a set of gradient field pulses applied just prior to the readout pulses. The second echo is shifted with a gradient field pulse 48 of area A, and the third echo is shifted with a combination of the shift pulse 48 and a shift gradient field pulse 50 of area B. Each shift of is independent of the other. A third or refocus gradient field pulse 52 is applied to refocus both the second and third echoes in the proper TR. Using equation (1) a shift of one TR for the second echo: (C−B)=2A+m, and a shift of 2 TRs for the third echo: C=3/2(A+B)+m. These can be rewritten as:

$$\left| \begin{array}{l} 2A + B - 2C + m = 0 \\ 3A + 3B - 2C + 2m = 0 \end{array} \right| \quad (2)$$

Solving the set of simultaneous equations and selecting areas A=B, then the area C is selected to meet the condition:

$$C = 3A + m \quad (3)$$

In an example of this sequence, each echo represents a different b-value or diffusion weighting. With one exponential curve fitted for perfusion and one fitted for diffusion, the perfusion and diffusion can be separated and apparent diffusion coefficients (ADC) calculated.

In FIG. 5, an embodiment of a multi-echo PRESTO imaging sequence such as combined Dixon and DWI reconstructions is diagrammatically illustrated. The RF pulse and gradient pulses are configured to generate three echoes. TE1 and TE2 are T1 weighted and can represent the echo times, for example, in a Dixon sequence. TE3 is a T2 weighted and can, for example, represent the echo time for a diffusion weighted reconstruction. In this embodiment, two echoes times, TE1 54 and TE2 56, are measured in the current TR 10 and one echo time, TE3 58, is shifted two TRs. However, as shown in the phase encoding 18, all three echoes are measured in the same phase and represent a common k-space data line. The selection of the rephrasing gradients, E, F and G, encodes the phase in the same direction with the same strength and opposite sign in the third TR. The echo shifting and diffusion weighting can be applied with different gradient fields in all three directions and therefore control the directional sensitivity of the diffusion weighting. With the same phase encoding, the three echoes cover the same line of k-space data even though the third echo is measured in a different TR. The area of the echo shifting gradients for the phase satisfy the following condition:

$$3(E+F)-2G=0 \qquad (4)$$

E and F are included in the first set of applied gradient field pulses which shifts in the phase, $G_p$ of the echo, and G is the refocusing applied gradient field pulse which refocuses the echo in the selected TR. In a slice selection direction 16, the slice select gradient field pulses include a net area, s, and the area of the slice refocusing gradient field pulses meets the following condition:

$$3(U+V)-2W-2s=0 \qquad (5)$$

areas U and V are included in the first set applied gradient field pulses, which shift the echo in the slice select direction. The area W refocuses the resonance to the selected slice in the third TR. (A+B), (E+F), and (U+V) are freely selectable and for imaging such as Diffusion Weighted Images (DWI) and Diffusion Tensor Images (DTI) generate different diffusion weighting and directions. The embodiment can be extended to additional echoes with short echo times and/or longer echo times. DWI supports tissue characterization in, for example stroke and oncology patients, and provides a biomarker in cancer treatment monitoring.

In FIG. 6, an embodiment of a diffusion weighted image whole body (DWIBS) reconstruction based on a combined DWI PRESTO imaging sequence is diagrammatically illustrated. From FIG. 5, an imaging sequence using three echo times is shown such as TE1 60, TE2 62, and TE3 with diffusion weighting 64. From the data lines generated from repeatedly generating first two echoes, E1 and E2, an in-phase (IP) image 66, an out-of-phase (OP) image 68, a water only (W) image 70, and a fat only (F) image 72 can be reconstructed. The Dixon reconstruction includes the water only image 70 and the fat only image 72. Additional information can also be derived such as a $B_0$ map and a T2* map. Using the first echo time 60 with a b-value=0 and the third echo time 64 as diffusion weighted, an apparent diffusion coefficient (ADC) map 74 can be constructed. A synthetic diffusion weighted whole body image with background suppression is constructed (DWIBS) from the water only image 70 and the fat only image 72, and the ADC map 74. With an overlay 78 of the ADC map 74 on the DWIBS 76, lesions can easily be detected.

Adjusting echo times provides flexibility in diffusion weighting and/or phase contrast independent from TR. Multi-echo PRESTO provides high scan efficiency compared to convention approaches. Convention approaches require separate sequences and registration between images while a multi-echo PRESTO is inherently registered and can be performed in less time. Additional examples of multi-echo PRESTO include a T2* map for body oxygen level dependent (BOLD) imaging, a Q-space or reciprocal k-space, a Susceptibility Weighted Image (SWI) including $B_0$ map phase correction, a Velocity flow encoding (VENC) image, and an Ultra short echo time (UTE) subtraction from longer echo times. The different echoes increase the dynamic range and accuracy of VENC phase contrast scans.

With reference to FIG. 7, an embodiment of a MR system 78 is schematically diagrammed. The system 78 includes a magnetic resonance (MR) imaging scanner 80 which is shown in a cross section. The MR imaging scanner 80 includes a main magnet 82 which generates a magnetic field $B_o$ in an axial direction. In the center of the MR imaging scanner is a bore 84 or opening which includes the area imaged. A patient is supported on a patient support 86 which moves in the bore 84 of the MR imaging scanner 80. One or more gradient coils 88 are controlled by a gradient controller 90 to generate the measurement or readout gradient pulses, $G_m$, the phase encoding gradient pulses, $G_p$, and the slice select gradient pulses. The gradient controller 90 selects, configures and activates the gradient coils 88 based on a selected imaging sequence. The gradient fields focus the excited resonance in a slice volume, and encode the resonance. The gradient fields also shift and refocus echoes. The MR imaging scanner 80 includes one or more RF coils 92 which are controlled by a RF controller 94 to generate the RF pulse each TR. The RF coils 92 can be incorporated into the MR imaging scanner 80 and/or be local (not shown) such as a head coil, leg coil, etc. The RF coils 92 which receive the gradient echoes can be the same as the coils which generate the RF pulse, e.g. transmit and receive, or can be separate, e.g. a receive only coil. A MR controller 96 controls the gradient controller 90 and the RF controller 94, and coordinates the transmitting of RF pulses which excite magnetic resonance and the measuring of the gradient echoes by the RF receiver coils. A RF receiver 97 receives and demodulates the readout pulses to form the lines of k-space. The MR controller 96 connects to a network 98. The network 98 includes one or more of the Internet, a local area network, a wide area network, a wireless network, a wired network, a cellular network, a data bus, such as USB and I2C, and the like.

A workstation 100 connects to the network 98 and a healthcare practitioner selects the imaging sequence using at least one input device 102. The workstation 100 includes an electronic processor or electronic processing device 104, a display 106 which displays the various images, menus, panels, and user controls, and the at least one input device 102 which inputs the healthcare practitioner selections. The workstation 100 can be a desktop computer, a laptop, a tablet, a mobile computing device, a smartphone, and the like. The input device 102 can be a keyboard, a mouse, a microphone, a touch screen display, one or more buttons, one or more switches, one or more toggles, and the like. The display 106 includes one or more of a LCD display, an LED display, a plasma display, a projection display, a touch screen display, and the like.

A database 108 connected to the network 98 stores various parameters for the difference possible imaging sequences. The parameters include the selection and run-time parameters of the gradient coils 88 and the various configurations to achieve the echo sequence for the imaging sequence selected. The database 108 can include files, tables, fields, objects, combinations, and the like stored in a memory. The memory includes one or more of a non-transient computer readable storage medium; a magnetic disk or other magnetic storage medium; an optical disk or other optical storage medium; a random access memory (RAM), read-only memory (ROM), or other electronic memory device or chip or set of operatively interconnected chips; an Internet server from which the stored instructions may be retrieved via the Internet or a local area network; or so forth. Further, as used herein, a controller includes one or more of a microprocessor, a microcontroller, a graphic processing unit (GPU), an application-specific integrated circuit (ASIC), a field-programmable gate array (FPGA), and the like.

A multi-echo PRESTO module 110 is suitably embodied by an electronic data processing device, such as the electronic processor or electronic processing device 104 of the workstation 100, or by a network-based server computer operatively connected with the workstation 100 by the network 98, or so forth. The module 110, in one embodiment, reconstructs the data lines into images and processes the images as described in conjunction with FIG. 6. Moreover, the disclosed imaging sequences and reconstruction techniques are suitably implemented as a non-transitory storage medium storing instructions (e.g., software) readable by an electronic data processing device and executable by the electronic data processing device to perform the disclosed imaging sequences and reconstruction techniques. The multi-echo PRESTO module 110 receives the imaging sequences to be performed based on the healthcare practitioner input and/or additional sources such as a patient medical record, hospital information system (HIS) and the like. Based on the imaging sequence which includes multiple gradient echoes generates by the RF pulse and the gradient pulses in each TR to generate at least one gradient echo shifted to a different TR. The module retrieves parameters from the database which configure the imaging device to perform the imaging sequence. The module provides the configuration to the MR controller and activates the MR controller to perform the sequence. The configurations include the configuration of the gradient pulses applied by the gradient coils such that a first set of gradient fields are applied to each echo to be shifted before the echo is measured in the current TR, and a second set of gradient fields applied after all the echoes in the current TR to refocus each of the shifted echoes in the correct TR.

FIG. 8 flowcharts one method of using an embodiment of the multi-echo PRESTO imaging. In a step 112, the imaging sequence is selected by the multi-echo PRESTO module. The step includes input from the healthcare practitioner using the workstation, and/or other sources such as the patient medical record, HIS, etc. The imaging sequence identifies each echo in the multiple echo sequence and which echo or echoes are shifted and how many TRs each echo is shifted. The step can include accessing the database for parameters and/or configuration and presentation to the healthcare practitioner for review. The multi-echo PRESTO module in a step 114, provides the configuration information to the MR controller to perform the imaging sequence. The MR controller configures the gradient controller and the RF controller.

In a step 116, the RF controller coordinated by the MR controller activates the RF coils to provide the RF pulse at the beginning of each TR, and the gradient controller to cause the gradient coils to induced at least two gradient echoes. The gradient coils in a step 118 apply the first and second gradient field pulses to shift one or more echoes from the current TR to selected subsequent TR. The first gradient field pulses applied to shift each echo, are applied prior to the echo read-out gradient pulse in the current TR. The first gradient field pulse applied to shift each echo can be applied differently for each shifted echo such as a different TR. The second gradient field pulse applied after the readout pulses and before the next RF pulse, refocus the one or more echoes in the selected subsequent TR. The gradient echoes are measured in each TR in a step 120 by the RF coils. The process is repeated in a decision step 122 for each TR, which begins by activating the RF coils to generate the RF pulse.

In a step 124, a set of data lines formed by the readout echoes are reconstructed into images. The reconstruction can include partial reconstruction and/or derivation of other information such as mapping, quantitative information, and the like. The reconstruction is repeated in a step 126 for the set of data lines from the echoes with each of the delay times. Reconstructions can include different orders of reconstructions and include results from one reconstruction in another such as with the Dixon reconstruction of the water only image and a fat only image, a DWIBS with the Dixon and the ADC map, etc.

In a step 128, the one or more images can be displayed and/or stored. The images can be displayed on the display device. The images can be stored in a storage management system such as a Picture Archiving and Communication System (PACS), Radiology Information System (RIS), and the like.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising:
    a magnetic resonance imaging device which includes:
        a magnet which generates a $B_0$ field;
        gradient coils which apply gradient fields to the $B_0$ field;

one or more radio frequency coils which generate a radio frequency excitation pulse to excite magnetic resonance and measure generated gradient echoes; and one or more processors configured to:
   activate the one or more radio frequency coils to generate a series of radio frequency pulses spaced by repetition times and to induce magnetic resonance;
   control the gradient coils to apply after each RF pulse:
      readout gradient field pulses which refocus the resonance into a plurality of gradient echoes;
      shift and refocus gradient field pulses which shift and refocus at least one of the echoes to a subsequent repetition time, wherein at least one readout gradient field pulse is applied before both the shift and refocus gradient field pulses, and another readout gradient field pulse is applied in-between the shift and refocus gradient field pulses; and
      receive and demodulate the gradient echoes to form k-space data lines; and
   reconstruct a plurality of images from the data lines; and
a display which displays the one or more reconstructed images.

2. The magnetic resonance imaging system according to claim 1, wherein the shift and refocus gradient field pulses include one or more first gradient field pulse and a second gradient field pulse of opposite polarity which has an area A(n+1)/(n)+m, where A is an area of the one or more first gradient field pulses, 2m is a total area of the measurement or readout gradient pulses, and n is a number of repetition times the portion shifted and refocused of the resonance is to be shifted.

3. The magnetic resonance imaging system according to claim 1, wherein one of the shift and refocus gradient field pulses is applied before at least one of the gradient echo inducing pulses.

4. The magnetic resonance imaging system according to claim 1, wherein one of the shift and refocus gradient field pulses is applied after the gradient echo inducing gradient field pulses and before a next radio frequency excitation pulse.

5. The magnetic resonance imaging system according to claim 1, wherein at least one of the gradient echo inducing pulses is disposed between a pair of the shift and refocus gradient field pulses.

6. The magnetic resonance imaging system according to claim 1, wherein the gradient echoes induced from the resonance excited by one of the RF pulses are induced in a plurality of repetition times.

7. The magnetic resonance imaging system according to claim 1, wherein the plurality of induced gradient echoes includes first and second echoes in a current repetition time and a third echo shifted to a subsequent repetition time.

8. The magnetic resonance imaging system according to claim 7, wherein the one or more processors is further configured to reconstruct the echoes in the current repetition time into an intra-voxel signal separation based on phase (DIXON) image, and the echoes shifted to the subsequent repetition time is reconstructed into a diffusion weighted image.

9. The magnetic resonance imaging system according to claim 8, wherein the one or more processors is further configured to reconstruct an apparent diffusion coefficient (ADC) map.

10. The magnetic resonance imaging system according to claim 8, wherein the one or more processors are further configured to:
   construct a diffusion weighted whole body image (DWIBS) with background body signal suppression from at least one reconstructed an intra-voxel signal separation based on phase (DIXON) image and a reconstructed ADC map.

11. The magnetic resonance imaging system according to claim 10, wherein the reconstruction includes at least one of:
   a T2* map for body oxygen level dependent (BOLD) imaging;
   a $B_0$ or phase map;
   a Diffusion Weighted Image (DWI) using selected echo shifting gradients as the diffusion weighting gradients;
   a Diffusion Tensor Imaging (DTI);
   a perfusion/diffusion separation;
   a Q-space or reciprocal k-space;
   a Susceptibility Weighted Image (SWI) including $B_0$ map phase correction;
   a Velocity flow encoding (VENC) image; and
   an Ultra short echo time (UTE) subtraction from longer echo times.

12. A method of magnetic resonance imaging, comprising:
   applying a series of radio frequency pulses separated by repetition times, each radio frequency pulse inducing magnetic resonance;
   applying readout gradient field pulses to induce a plurality of magnetic resonance echoes and shift and refocus magnetic field gradient pulses to shift and refocus at least one of the induced gradient echoes in a subsequent repetition time, wherein at least one readout gradient field pulse is applied before both the shift and refocus gradient field pulses, and another readout gradient field pulse is applied in-between the shift and refocus gradient field pulses;
   measuring the gradient echoes to generate data lines; and
   reconstructing a plurality of images from the data lines.

13. The method of magnetic resonance imaging according to claim 12, wherein the shift and refocus gradient field pulses include one or more first gradient field pulse and a second gradient field pulse of opposite polarity which has an area A(n+1)/(n)+m, where A is an area of the one or more first gradient field pulses, 2m is a total area of the measurement or readout gradient pulses, and n is a number of repetition times the portion shifted and refocused of the resonance is to be shifted.

14. The method of magnetic resonance imaging according to claim 12, wherein one of the shift and refocus gradient field pulses is applied before at least one of the gradient echo inducing pulses.

15. The method of magnetic resonance imaging according to claim 12, wherein one of the shift and refocus gradient field pulses is applied after the gradient echo inducing gradient field pulses and before a next radio frequency pulse.

16. The method of magnetic resonance imaging according to claim 12, wherein the plurality of induced gradient echoes includes first and second echoes in a current repetition time and a third echo shifted to a subsequent repetition time.

17. The method of magnetic resonance imaging according to claim 12, wherein each shifted echo includes a different diffusion weighting.

18. A non-transitory computer-readable storage medium carrying software which controls one or more electronic data processing devices to control a magnetic resonance imaging system to:

apply a series of radio frequency pulses separated by repetition times, each radio frequency pulse inducing magnetic resonance;

apply readout gradient field pulses to induce a plurality of magnetic resonance echoes and shift and refocus magnetic field gradient pulses to shift and refocus at least one of the induced gradient echoes in a subsequent repetition time, wherein at least one readout gradient field pulse is applied before both the shift and refocus gradient field pulses, and another readout gradient field pulse is applied in-between the shift and refocus gradient field pulses;

measure the gradient echoes to generate data lines; and reconstruct a plurality of images from the data lines.

19. A magnetic resonance imaging system, comprising:

a magnetic resonance imaging device; and one or more processors configured to:

activate one or more radio frequency coils which generate a radio frequency pulse at the start of each of a plurality of repetition times;

activate gradient coils to induce at least two gradient echoes in each repetition time;

activate the gradient coils to apply one or more first gradient fields which shifts at least one induced gradient echo from a current repetition time, and apply one or more second gradient fields which refocuses the at least one shifted gradient echo in a subsequent repetition time, wherein a readout gradient field pulse is applied before both the shift and refocus gradient fields, and another readout gradient field pulse is applied in-between the shift and refocus gradient fields; and reconstruct images from the induced gradient echoes measured by one or more radio frequency coils.

* * * * *